United States Patent
Hametner et al.

(10) Patent No.: US 10,338,146 B2
(45) Date of Patent: Jul. 2, 2019

(54) METHOD FOR DETERMINING A CONTROL OBSERVER FOR THE SOC

(71) Applicant: AVL LIST GMBH, Graz (AT)

(72) Inventors: Christoph Hametner, Vienna (AT); Stefan Jakubek, Vienna (AT); Amra Suljanovic, Graz (AT)

(73) Assignee: AVL List GmbH, Graz (AT)

( * ) Notice: Subject to any disclaimer, the term of this patent is extended or adjusted under 35 U.S.C. 154(b) by 434 days.

(21) Appl. No.: 14/762,719

(22) PCT Filed: Jan. 17, 2014

(86) PCT No.: PCT/EP2014/050905
§ 371 (c)(1),
(2) Date: Jul. 22, 2015

(87) PCT Pub. No.: WO2014/114564
PCT Pub. Date: Jul. 31, 2014

(65) Prior Publication Data
US 2015/0362559 A1    Dec. 17, 2015

(30) Foreign Application Priority Data

Jan. 23, 2013  (AT) .............................. A50046/2013
Nov. 6, 2013  (AT) .............................. A50736/2013

(51) Int. Cl.
*G01R 31/36* (2019.01)
*G01R 31/367* (2019.01)
(Continued)

(52) U.S. Cl.
CPC ....... *G01R 31/367* (2019.01); *G01R 31/3828* (2019.01); *G01R 31/3842* (2019.01); *G01R 31/392* (2019.01)

(58) Field of Classification Search
CPC .............. G01R 31/3651; G01R 31/361; G01R 31/3624; G01R 31/3679
(Continued)

(56) References Cited

U.S. PATENT DOCUMENTS 6,534,954 B1 * 3/2003 Plett ................... G01R 31/3651
                                                              320/132
7,197,487 B2 3/2007 Hansen et al.
(Continued)

FOREIGN PATENT DOCUMENTS

DE  102010040451  3/2012
WO  2006057468    6/2006
(Continued)

OTHER PUBLICATIONS

Hametner et al., State of charge estimation for Lithium Ion cells: Design of experiments, nonlinear identification and fuzzy observer design, Apr. 19, 2013.*
(Continued)

*Primary Examiner* — Alexander Sofocleous
*Assistant Examiner* — Alfredo Bermudez Lozada
(74) *Attorney, Agent, or Firm* — Dykema Gossett PLLC

(57) ABSTRACT

In order to create a control observer for any battery type in a structured and at least partially automated manner, first, a nonlinear model of the battery, in form of a local model network including a number of local, linear, time-invariant, and dynamic models, which each have validity in specific ranges of the input variables, is determined from the measuring data of a previously ascertained, optimized experimental design via a data-based modeling method. For each local model ($LM_i$) of the model network determined in this manner, a local observer is then determined. The control observer (13) for estimating the SoC then results from a linear combination of the local observers.

9 Claims, 7 Drawing Sheets

(51) Int. Cl.
*G01R 31/392* (2019.01)
*G01R 31/3828* (2019.01)
*G01R 31/3842* (2019.01)

(58) Field of Classification Search
USPC .......................................................... 702/63
See application file for complete search history.

(56) References Cited

U.S. PATENT DOCUMENTS

| | | |
|---|---|---|
| 7,583,059 B2 | 9/2009 | Cho |
| 8,706,333 B2 | 4/2014 | Li |
| 8,880,253 B2 | 11/2014 | Li et al. |
| 2004/0207367 A1 | 10/2004 | Taniguchi et al. |
| 2011/0148424 A1 | 6/2011 | Chiang et al. |
| 2013/0006455 A1* | 1/2013 | Li .................... G01R 31/3651 701/22 |
| 2014/0302355 A1 | 10/2014 | Boehm et al. |

FOREIGN PATENT DOCUMENTS

| | | |
|---|---|---|
| WO | 2011057846 | 5/2011 |
| WO | 2012171730 | 12/2012 |

OTHER PUBLICATIONS

Hametner et al., Optimal experiment design based on local model networks and multilayer perceptron networks, Jun. 19, 2012.*
Senthil et al., Nonlinear State Estimation Using Fuzzy Kalman Filter, 2006.*
English Abstract of DE 102010040451.

* cited by examiner

METHOD FOR DETERMINING A CONTROL OBSERVER FOR THE SOC

The present invention relates to a method for determining a control observer for estimating the SoC of a battery.

In well-known battery management systems, for example, the battery of an electric or hybrid vehicle, the state of charge (SoC) of the battery or a battery cell is determined as a function of the variables measured in the vehicle, for example, of the charging or discharging current or of the battery voltage and temperature. This is often carried out by a control SoC observer, which normally uses a nonlinear battery model, which models the nonlinear battery behavior of the battery voltage as a function of the charging and discharging current. On the basis of this model and the battery voltage measured in the vehicle, the SoC-observer then estimates the actual state of charge of the battery. This is, for example, known from the publication DE 10 2009 046 579 A1, which uses a simple equivalent electric circuit as a model of the cell.

In this instance, a problem is that each battery type requires its own model. Such models are, however, difficult to parameterize (for example, electro-chemical models) and/or are only trustworthy in a specific parameter range, for example, only within a specific temperature range (for example, electric models on the basis of an equivalent circuit) and/or are, owing to their complexity, unsuitable for real-time applications and, for this reason, for application in a battery management system.

A further problem is the creation of the control observer itself, which has to possibly meet different requirements for different models (battery types). Here, an extended Kalman filter is frequently used for estimating a nonlinear state. In this case, a linearization of the nonlinear model occurs in each time step. Depending on the applied model structure, this approach results, however, in a high to very high computational cost, which makes the implementation in a battery management system difficult or costly.

For this reason, it is an object of the present invention to specify a method, which enables to create a control observer for any battery type in a structured and at least partially automated manner and which requires the least possible computational cost.

This object is achieved by the features of Claim 1. For this purpose, a nonlinear model of the battery, in form of a local model network including a number of local, linear, time-invariant, and dynamic models, which each have validity in specific ranges of the input variables, is determined via a data-based modeling method from the measuring data of a previously ascertained, optimized experimental design. For each local model determined in this manner, a local observer is then determined. The control observer for estimating the SoC then results from a linear combination of the local observers. Within this context, such data based modeling methods have the advantage that they are suitable for different battery types and also for real-time applications. Furthermore, the method may be carried out to the greatest possible extent in an automated manner, so that the effort for creating the SoC observer can be reduced.

As the method for creating the SoC observer is based on an experimental design, which is carried out by a real battery using real measurements, the therewith obtained measurements and the models depend on the state of health of the battery at the time of the measurements. Thus, the resulting observer for the SoC delivers imprecise estimates for other aging conditions for the SoC. In order to now take the state of health of the battery into account when estimating the SoC, it is advantageous if at least one input variable or at least one model parameter or at least one validity function of the local model network, thus, of the nonlinear battery model, is scaled by at least one parameter for the state of health of the battery. In this manner, the SoC observer is able, independent of the current state of health of the battery, to deliver good estimates for the SoC or to determine the state of health of the battery as an additional estimated value. An advantage of this methodology thus is that the change in the state of health may be accounted for by a single parameter.

In the following, the present invention is described in more detail in reference to FIGS. 1 through 8, which, in an exemplary manner, schematically and non-restrictively show advantageous refinements of the present invention.

Figure 7:
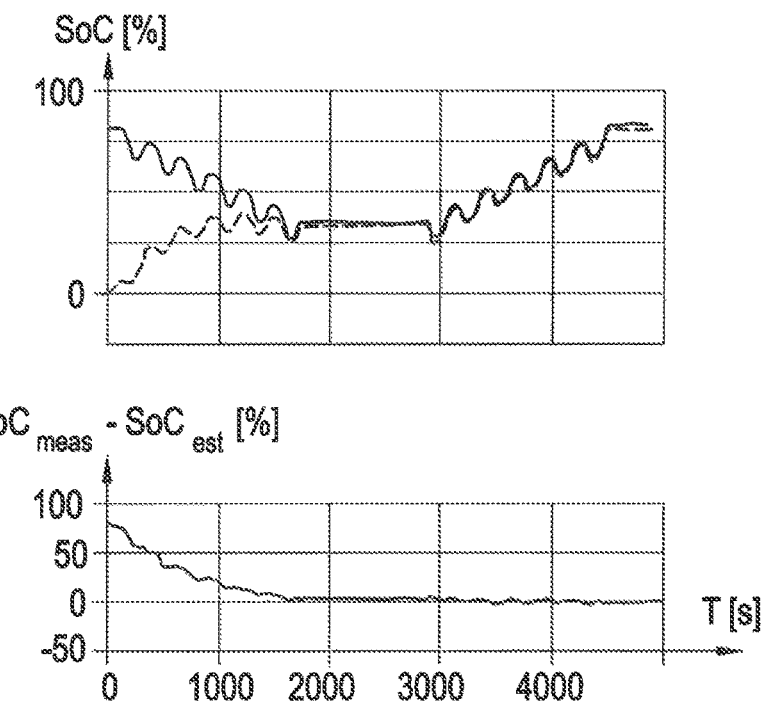
Figure 8:
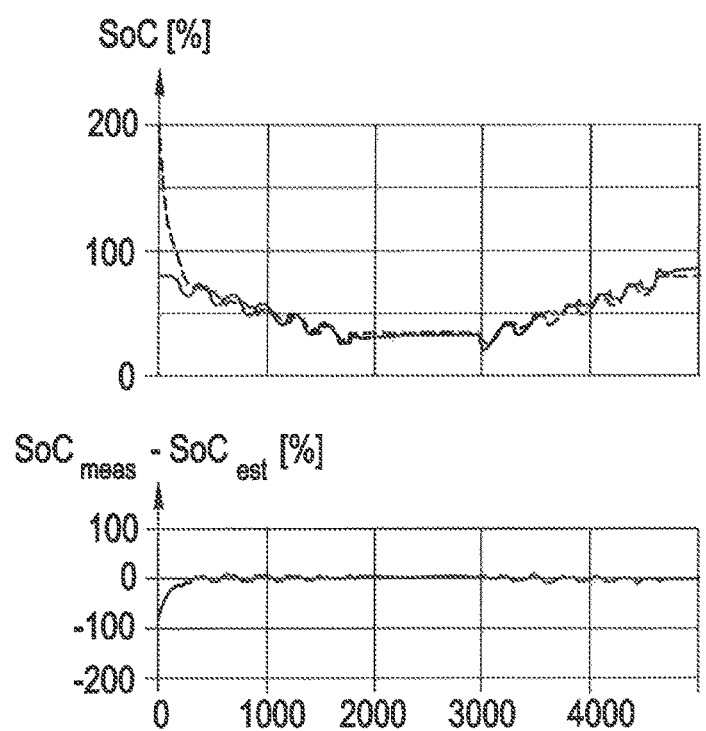
Figure 9:
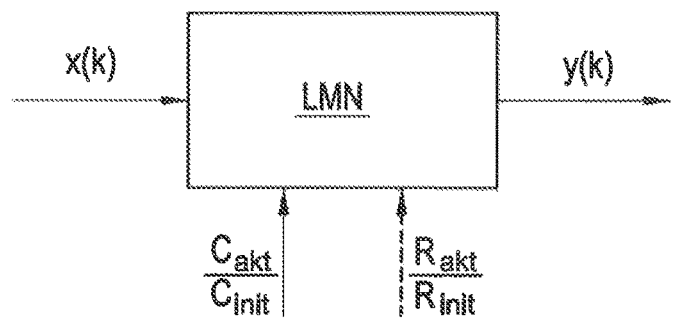
Figure 10:
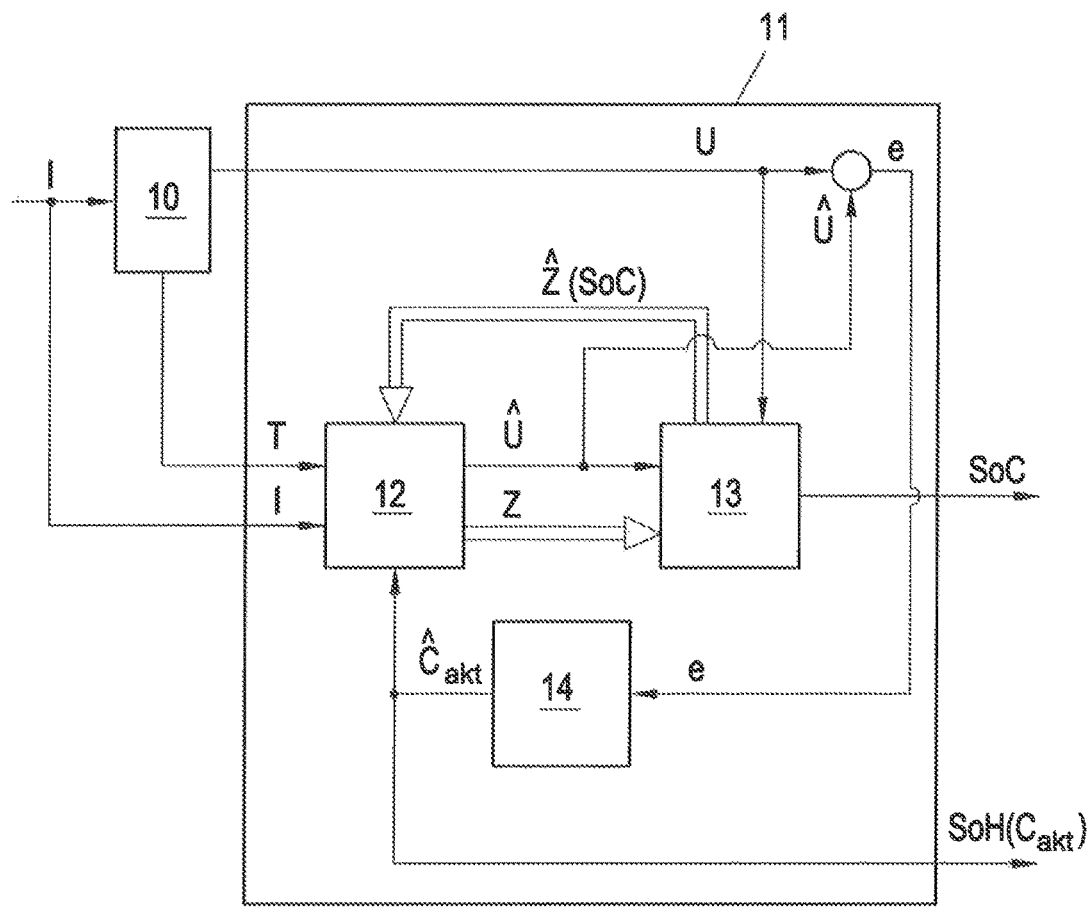
Figure 11:
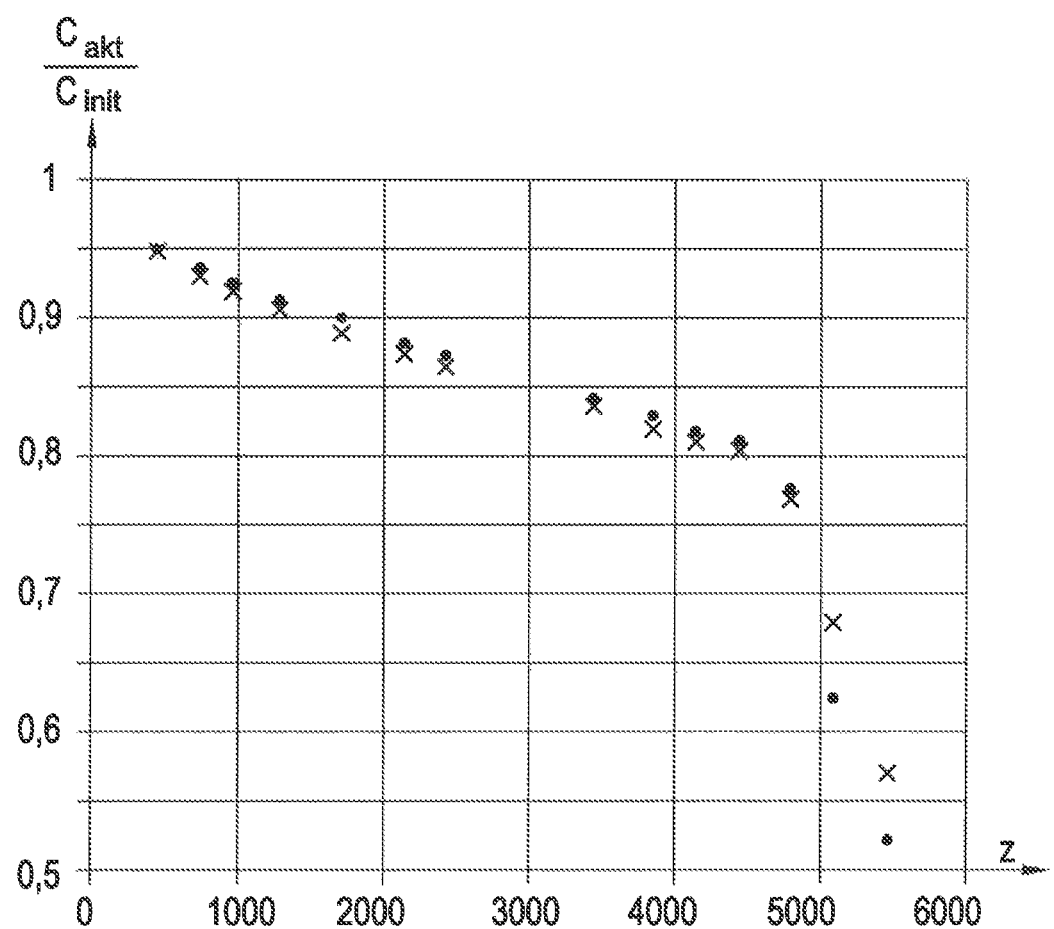

FIGS. 7 and 8 each show a comparison of the estimated SoC and a measured SoC; and FIG. 9 shows use of the SoH in a local model network model of the battery;

FIG. 10 shows extension of the battery management system with an estimation of SoH; and FIG. 11 shows the estimated SoH over charging/discharging.

In a first step of the method according to the present invention, a simple initial model of the battery or the battery cell is determined. Subsequently, the terms battery and battery cell are considered as equivalent within the context of the present invention. In this instance, any known model of any battery cell is assumed. The known battery model is, for example, a model known from another battery, a linear battery model or a nonlinear battery model. A simple linear model may, for example, be determined in that a current pulse is applied at the battery or battery cell and, in this instance, the resulting voltage is measured. The application of the known impedance spectroscopy may also be used for creating a simple battery model. A linear battery model, for example, a simple current-voltage relationship, may be determined from these data by means of methods of identification. Even though such a step attempt only applies to a specific operating point of the battery or the battery cell and only to the concrete current pulse, such a simple initial model suffices as a starting point for the methodology according to the present invention, as it is described below.

Based on the simple linear initial model of the battery, the optimal excitation for the battery or battery cell is now determined by means of a model-based design of experiments (DoE) methodology. For this purpose, an operating range of the battery cell as great as possible, preferably the total operating range of the battery cell, is to be covered, a high precision, also for the highly dynamic excitation, is to be achieved and effects of the battery cells, such as charge-discharge hysteresis and relaxation (vibration behavior), are also to be considered. Common methods for experimental design for nonlinear systems use, for example, amplitude-modulated, pseudo-random, binary signals (APRB signals) for exciting the system dynamic. These methods may, however, not be used in the present application in batteries because the SoC is directly dependent on the excitation signal (the load current of the battery cell), for example, according to the relation $$SoC(t) = SoC_0 + \int_{\tau=0}^{t} \frac{\eta_i(I)I(\tau)}{C_n} d\tau,$$

with I(t) being the instantaneous load current, $C_n$ being the nominal cell capacity and $\eta_i(I)$ being the coulombic efficiency. Hence, the application in batteries has to be approached differently. In this instance, the DoE has to also ensure that the excitation signal constitutes a suitable and sufficient excitation of the battery and, at the same time, that the total operating range of the SoC is covered. Moreover, the time for carrying out the battery tests is preferably also taken into account.

An optimally model-based DoE is frequently determined by the so-called Fisher information matrix $I_{FIM}$ and a judgment criterion, for example, a D-optimal judgment criterion. According to this judgment criterion, the determinant $J_{FIM}$ of the Fisher information matrix $I_{FIM}$ is to be maximized. In addition to the D-optimal judgment criterion, there are, of course, additionally known judgment criteria, which also may be applied. This is well-known and here is not explained in further detail.

For this purpose, the previously determined (for example, from individual step attempts) simple initial model $y=f(\psi)$ may be used to determine the Fisher information matrix. The Fisher information matrix $I_{FIM}$ is, as it is generally known, based on the partial derivative of the model output y according to the model parameters $\psi$ in the form $$I_{FIM} = \frac{1}{\sigma^2} \sum_{k=1}^{N} \frac{\partial y(k,\psi)}{\partial \psi} \frac{\partial y(k,\psi)^T}{\partial \psi}.$$

Figure 1:
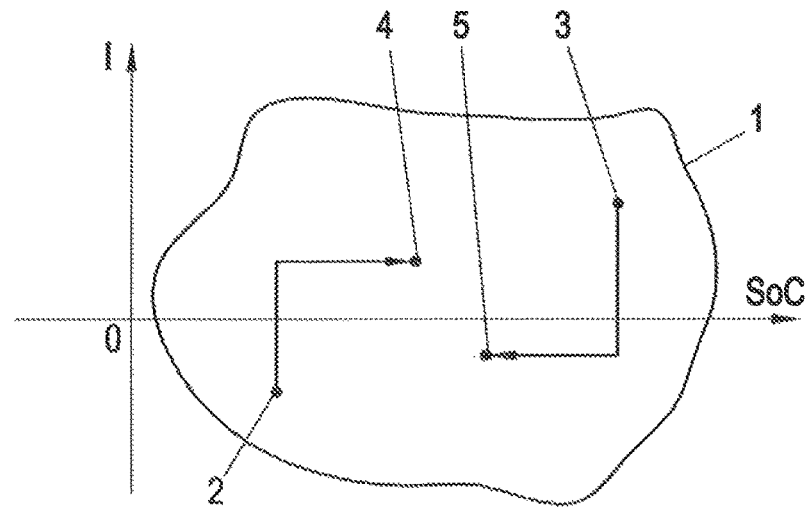
FIG. 1 shows the change of the SoC as a function of the load current.

For the present application, an excitation signal based on a specified number of design points, which are each provided by the load current and the SoC value, is specified at the onset. In order to meet the above-mentioned requirements for the excitation, the object of the following optimization is an optimal time-sequential arrangement of such design points. For each design point, the sign of load current I (as charging or discharging) and the duration of load current I depend on the SoC to be reached and on the previous SoC, as described in FIG. 1. Within allowed parameter range 1 (the input space), a new SoC 4, 5 may, based on a specified current SoC 2, 3, only be reached if load current I is either increased (charged) for a specified time period or lowered (discharged) for a specified time period. Consequently, the duration of these charging or discharging pulses and, for this reason, also test time T depend in this instance directly on this time-sequential succession and the respective assignment of load current and SoC value of the design points. So, the test time T may also be subject of the optimization and, hence, of the optimal DoE. This may be reached, for example, in that a result function $$J_{opt} = \alpha \frac{J_{FIM,init}}{J_{FIM,opt}} + (1-\alpha)\frac{T_{opt}}{T_{init}}$$

is minimized. In this instance, quantities having the index "init" reference the respective quantities for the initial experimental design (starting point of the optimization) and "opt" references the optimized quantities as the result of the optimization. The weighting parameter $0 \leq \alpha \leq 1$ weights between accuracy and test time. The more $\alpha$ increases, the more the information content of the excitation signal increases, whereas the reduction of the test time is weighted heavier, the smaller $\alpha$ is selected. As it is widely known, such optimizing problems are able to be solved, for example, by a heuristic optimizing method (for example, a simulated annealing method), or other known methods.

Figure 2:
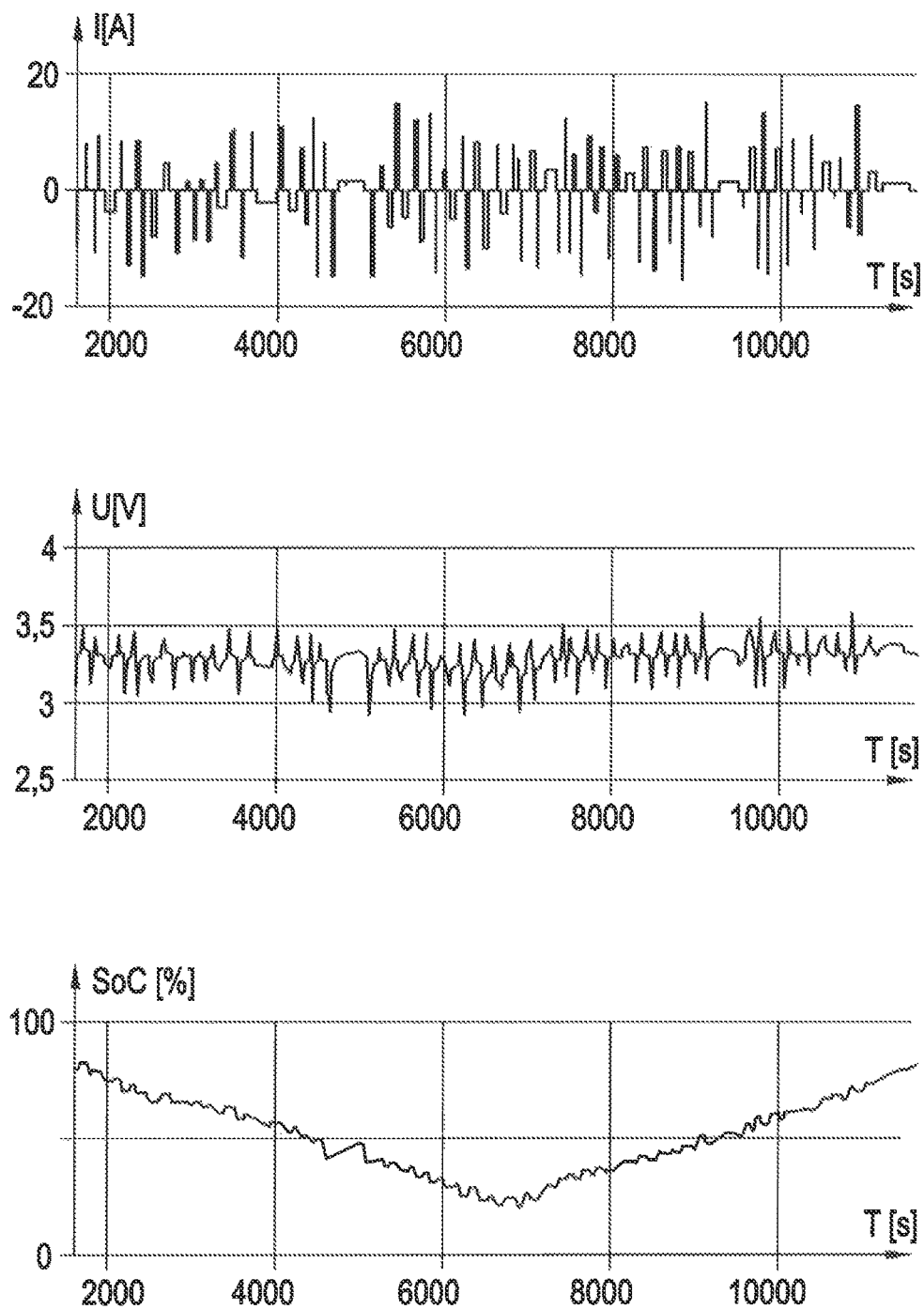
FIG. 2 shows an initial experimental design for determining an optimized experimental design.
Figure 3:
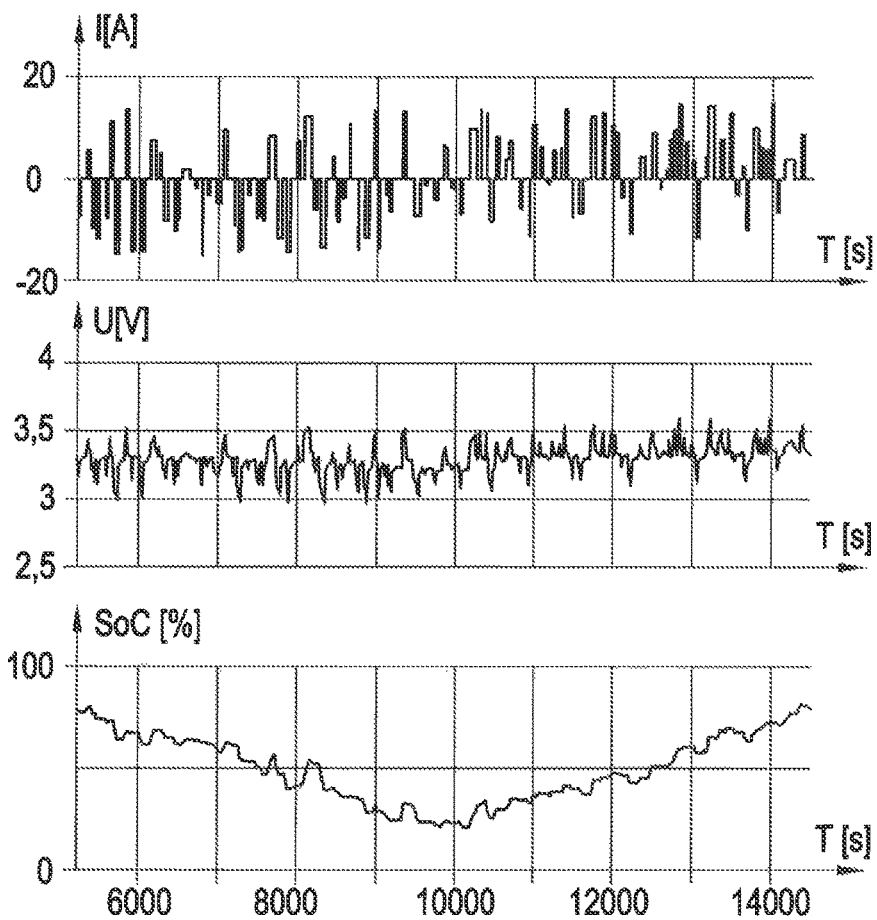
FIG. 3 shows an optimized experimental design.
Figure 4:
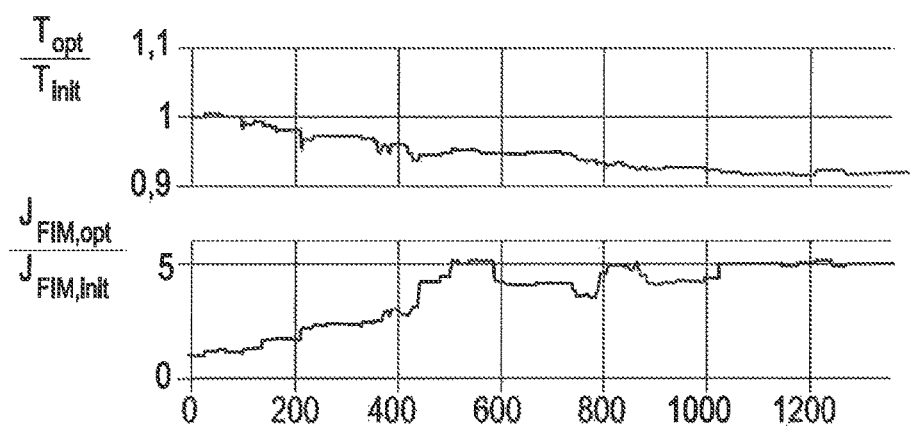
FIG. 4 shows an illustration of the optimized experimental design improving the information content and the test time.

FIG. 2 shows in an exemplary manner an initial DoE (initial experimental design) consisting of a number of time-sequential design points. The experimental design results from a respectively selected succession of the desired design points (defined via load current and SoC). In order to be able to determine the voltage hysteresis and the relaxation behavior of the battery cell, individual phases of charging or discharging pulses having a load current I=0 may follow. This initial design was the starting point for a simulated annealing algorithm for determining an optimized DoE (optimized experimental design), as it is shown in FIG. 3. The test time results from the sequenced succession and the assigning of load current and SoC of the design points. FIG. 4 shows the improvement of determinant $J_{FIM}$ of the Fisher information matrix $I_{FIM}$ by a factor of approximately five while simultaneously shortening test time T by approximately 7% when carrying out the optimization.

The optimized experimental design, using this procedure, substantially covers the total operating range of the battery cell and substantially detects the total nonlinear dynamic behavior of the battery cell. Subsequently, the experimental design is run on the test bench for the battery cell, that is, the individual design points are applied to the battery cell within the determined time sequence according to the experimental design and, in this instance, measurements are carried out at the battery cell to determine state values of the battery. This may also occur in an automated or partially automated manner. A model of the battery or the battery cell may then be determined in an automated manner from these measurements. In this instance, for example, current, voltage and temperature of the battery may be measured, and the initial experimental design is also assumed as known at the beginning of the measurement.

Figure 6:
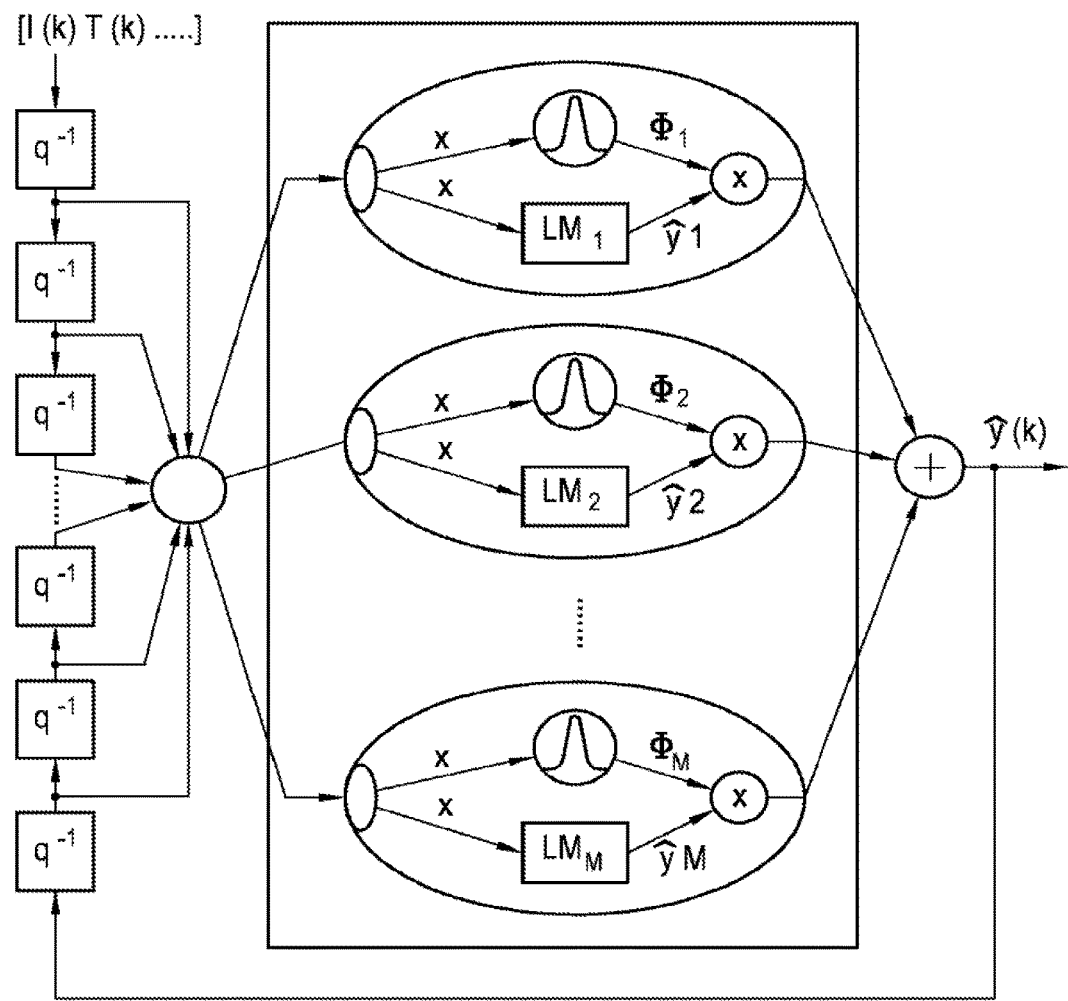
FIG. 6 shows a block diagram of a linear model network.

In order to create a nonlinear model of the battery, methods of nonlinear model identification known per se may also be used. Subsequently, this data-based modeling is described on the basis of a local model network (LMN), as it is subsequently described on the basis of FIG. 6. An LMN interpolates between local models, which are respectively valid in specific operating ranges (or ranges of input variables).

For this purpose, each ith local model $LM_i$ of the LMN may have two parts, namely a validity function $\Phi_i$ and a model parameter vector $\theta_i$. The model parameter vector $\theta_i$ includes all parameters for the ith model and the validity function $\Phi_i$ defines the scope of validity of the ith local model (within the input space). A local estimated value of the starting variable $\hat{y}_i(k)$ as an output of ith locale model $LM_i$ at time k results from $\hat{y}_i(k) = x^T(k)\theta_i$, and x(k) denotes a regression vector, which includes present and past inputs and outputs, for example, cell current I(k) and its last four past values I(k−1) . . . I(k−4), the last SoC(k−1) and cell temperature T(k−1). The global model output $\hat{y}(k)$, for example, the cell voltage U(k), then results from a linear combination with a weighting of the M local model outputs by the validity function $\Phi_i$ in the form $$\hat{y}(k) = \sum_{i=1}^{M} \Phi_i(k)\hat{y}_i(k).$$

The nonlinear system behavior of the battery is subsequently described by the LMN via locally valid, linear models. These sub-models are respectively valid in a certain portion (defined via current, SoC, temperature, etc.) of the total operating range.

For example, the model output may be provided by $y(k)=U(k)$ and the regression vector by $x(k)=[U(k-1), U(k-2), \ldots, U(k-n), I(k), I(k-1), \ldots, I(k-m), T(k-1), SoC(k-1), 1]^T$, where m and n specify the respective system orders. The model parameter vector $\theta_i$ then would be, for example, $[a_{U,1}, a_{U,2}, \ldots, a_{U,n}, b_{I,0}, b_{I,1}, \ldots b_{I,m}, b_{T,1}, b_{SoC,1}, c_0]$. In this instance, U refers to the voltage of the battery, I to the current and T to the temperature, which are known in the respective system order (k), (k−1), ... (k−n) as measurements from the determined and executed experimental design and which serve as training data for the modeling identification. The result of the experimental design is subsequently used for the model identification, and the model parameters or the model parameter vector $\theta_I$ is/are determined by a well-known optimization, for example, by the method of least squares, which minimizes the error between estimated output and measured output, or similar optimizing methods.

A nonlinear model of the battery results, which predicts output $\hat{y}(k)$, for example, U(k), as a function of the input variables, for example, current I and temperature T, as well as past values of these variables.

A control observer for the SoC may then be determined from the nonlinear model of the battery determined in such a manner in form of the LMN, which here is described using the example of a fuzzy observer. Using a fuzzy observer enables a simple and automated parameterizing of the nonlinear state observer. The stationary design of the local filter enables a real-time capable implementation because the computational cost is low in each time step (in contrast to, for example, the extended Kalman filter). Each local model of the LMN is a linear, time-variant, and dynamic system. Hence, by using the standard Kalman filter theory, a local observer is created for each local linear state space model. A global filter then results from a linear combination of the local filters. Hence, the nonlinear observer behavior includes the description of the nonlinear system as local, linear state space models. In this instance, state vector z(k−1) of the system is substantially supplemented by state SoC(k−1), which previously served as an input for determining the LMN. This results from a combination of the LMNs with the previous relative SoC model in the form $$SoC(k) = SoC(k-1) + \frac{T_S}{C_n} i(k),$$

where Ts refers to the sampling time. The state vector $z_I(k)=A_I z(k-1)+B_I u(k)$, having system matrix $A_I$, input matrix $B_I$ and input vector u(k), results for the ith locale model according to the state space model, whereas the state vector z(k−1) includes state SoC(k−1) and system matrix $A_I$ and input matrix $B_I$ include the previously determined model parameters. Consequently, the state vector for the system state results again by weighting the local states with the validity function $\Phi_I$ according to $$z(k) = \sum_{i=1}^{M} \Phi_i(k-1)\{A_i z(k-1) + B_i u(k)\}$$

and the global model output y(k)=Cz(k) according to C=[1 0 . . . 0 0].

In the above example, state vector z(k) includes past outputs and the state of charge according to $z(k)=[U(k-1), U(k-2), \ldots, U(k-n), SoC(k-1)]^T$ and input vector u(k) includes the current and time delayed input variables (and the offset term of the local models) in the form u(k)=[I(k), I(k−1), . . . , I(k−m), T(k−1), 1].

In this instance, an observer is necessary because the relative SoC model is unreliable in the long-term and delivers false results and, furthermore, the initial state of charge has to be exactly known, which typically is not the case. The observer is able to adapt this state based on measured real input and output variables and, thus, to compensate for errors emerging from the false initializing or the unreliability of the model.

A local Kalman filter having gain matrix $K_I$ may be determined for each local model of the LMN to estimate the local state. Estimated state $\hat{z}(k)$, which includes the estimated SoC, then follows from the equation $$\hat{z}(k) = \sum_{i=1}^{M} \Phi_i(k-1)\{z_i^*(k) + K_i[y(k) - \hat{y}(k)]\} \text{ with}$$

$$z_i^*(k) = A_i \hat{z}(k-1) + B_i u(k) \text{ and } \hat{y}(k) = \sum_{i=1}^{M} \Phi_i(k-1)Cz_i^*(k).$$

Determining the Kalman gain matrix $K_I$ is carried out, for example, by the known discrete algebraic Riccati equation (DARE) having the covariance matrices describing the measurement noise and the process noise. These covariance matrices may in this case be determined, for example, by known methods from measurements obtained on the test bench.

The covariance describing the process noise of the SoC in the covariance matrices may, however, also be considered and used as an adjustable tuning parameter for the nonlinear SoC observer, as it is shown on the basis of FIGS. 7 and 8. Both FIGS. 7 and 8 show the function of the control observer. It is evident from both figures that the estimate of the SoC (respectively, the dashed curve diagram) approaches, even in the case of random initial data, the actual value of the SoC. In FIG. 8, the weighting of the SoC has been increased in the state, which resulted in a faster convergence but in a slightly increased error.

Figure 5:
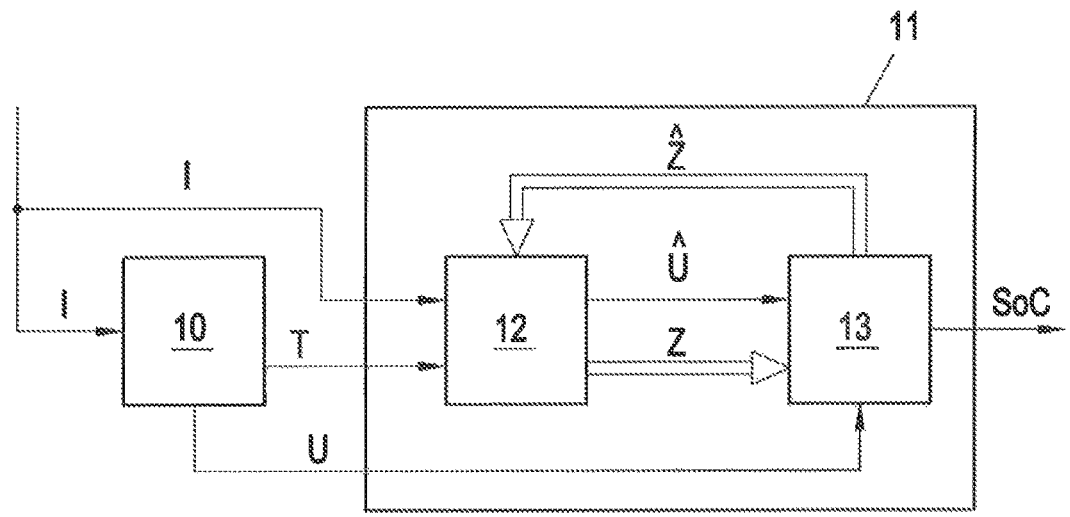
FIG. 5 shows an integration of the SoC observer into a battery management system.

As shown in FIG. 5, the determined control observer for estimating the SoC may easily be integrated into a battery management system 11. Load current I of a battery 10 generates a battery voltage U and a battery temperature T, which are introduced as measurements to battery management system 11. Extended state space model 12 determined according to the present invention and nonlinear observer 13, which estimates the current SoC, are implemented in said battery management system. The estimated SoC then may be respectively further used, for example, in battery management system 11 itself, or in a battery or vehicle control unit not shown.

In addition to estimating state of charge SoC, it is important to determine the state of health (SoH) to be able to specify a criterion for the quality of battery 10. A universally applicable definition for the SoH does not, however, yet exist. The state of health SoH of a battery is often specified by a parameter, for example, as the ratio between available capacity $C_{akt}$ of the battery in comparison to known nominal capacity $C_{init}$ of the battery, thus, $C_{akt}/C_{init}$. In order to enable an efficient use of battery 10 and, thus, to achieve a service life as long as possible, the SoH or a parameter thereof is preferably most exactly determined also, for example, by battery management system 11, because current state of health SoH also influences the determination of state of charge SoC. In order to exactly determine state of charge SoC of an aged battery 10, it is, for this reason, advantageous if the respectively current state of health SoH is also taken into account when determining state of charge SoC. Subsequently, it is now described, how the SoC observer described above may be supplemented to also account for or determine state of health SoH.

Unlike traditional modeling approaches (chemical-physical models, equivalent circuit models, etc.), the purely data based (black box) battery model described above in form of the LMN or state space model 12 derived thereof does not include any physical information about battery 10 itself. The model parameter included in the model parameter vector $\theta_I$ are, however, related by relation $\hat{y}_i(k) = x^T(k)\theta_I$ to the input variables in regression vector x(k) and to output variable y(k). This capability of interpreting local model network LMN may now be used to determine or extract the variables influencing state of health SoH from the LMN and, via these influencing variables, to influence the battery model or the estimation of the SoC. The object is to also reflect, by adapting these influencing variables, the dynamic behavior of output variable y(k), for example, of battery voltage U(k), of aging batteries 10 via the LMN or state space model 12 derived thereof and, in doing so, to enable a precise estimate of the SoC. In this manner, state of health SoH may additionally be determined, issued and further used as an additional variable.

In the most simple case, the parameter for state of health SoH is available capacity $C_{akt}$ or the ratio of the available capacity $C_{akt}$ compared to nominal capacity $C_{innit}$, thus, is $C_{akt}/C_{init}$. Current internal resistance $R_{akt}$ or the ratio of current internal resistance of aged battery $R_{akt}$ compared to the known internal resistance of a new battery $R_{init}$, thus, $R_{init}/R_{akt}$, or a combination thereof may, however, also be taken into account as a parameter for state of health SoH. As indicated in FIG. 9, a battery model in form of the LMN may then, by specifying the parameter, for example, $C_{akt}/C_{init}$ and/or $R_{akt}/R_{init}$, be adapted to simulate the behavior of output variable y(k) for known input variables x(k) for any resulting states of health SoH. In this instance, the effect of this/these parameter(s) may be converted to at least one model parameter in the model parameter vector $\theta_i$, and, if applicable, to the validity functions $\Phi_I$, and/or to at least one input variable x(k), and an adaptation of the static and dynamic behavior of the nonlinear battery model occurs. Simultaneously, using such a supplementing battery model, the observer, which is derived from said battery model, for state of charge SoC, as described above, enables to also determine state of charge SoC as a function of current state of health SoH. In the following, this to be described using the above example.

Being capable of interpreting local linear models $LM_i$ of local model network LMN, model parameters, for example, $a_{U,1}, a_{U,2}, \ldots, a_{U,n}, b_{I,0}, b_{I,1}, \ldots b_{I,m}, b_{T,1}, b_{SoC,1}, c_0$, determining model parameter vector $\theta_I$ or system matrix $A_I$ in state space model 12, may be changed accordingly to take into account the aging of battery 10. Similarly, input variables x(k) of local model network LMN or the state variables in state space model 12 may be changed. In the following, possibilities are specified in an exemplary manner to take into account the parameter(s) for state of health SoH:

Adapting the internal resistance: Via model parameter $b_{I,0}$, which is associated with current I(k) and which, for an output variable U(k), has the property of a resistor, internal resistance R of battery 10 may directly be influenced. In this manner, model parameter $b_{I,0}$ may be scaled, for example, according to so parameter $R_{akt}/R_{init}$.

Adapting the steady state gain: The steady state gain of the transfer function (as the ratio of input and output) may be adapted via model parameters $b_{I,1}, \ldots b_{I,m}, b_{T,1}, b_{SoC,1}$, assigned to the input variables or directly via the input variables Adapting the capacity in the relative SoC model: The observer for the SoC takes into consideration the relation between current and SoC via the relative SoC model in the form $$SoC(k) = SoC(k-1) + \frac{T_s}{C_n} i(k).$$

In this instance, by aligning or scaling capacity $C_n$, the change in capacity may be taken into consideration via the aging. The scaling, in this instance, may occur as a function of the parameters, for example, $C_{akt}/C_{init}$, if applicable, by taking the current SoC into account.

A parameter, for example, $C_{akt}/C_{init}$, may be used to scale input signals (for example, states in the state space model) of the system, for example, in form of an SoC correction in the battery model or in state space model 12, for example, via the model parameter $b_{SoC,1}$. In this instance, the scaling may be carried out as a function of the parameter, for example, $C_{akt}/C_{init}$, for example, by $SoC_{nom} = SoC*C_{init}/C_{akt}$, where SoC is the estimated SoC and $SoC_{nom}$ is the scaled and fed back SoC.

A parameter, for example, $C_{akt}/C_{init}$ may be used to correct the steady-state gain $K_I$ of the transfer function of the local linear models $LM_I$ and the battery current via the model parameters $b_{I,1}, \ldots b_{I,m}$, for example, by $K_{I,nom} = K_I*C_{akt}/C_{init}$, where $K_I$ is the steady-state gain resulting from the model and $K_{I,nom}$ is the scaled one.

Knowing or having the specifications for the parameter thus enables nonlinear battery model LMN or state space model 12 and, thus, the estimate of the SoC to be adapted to the current state of health. In this instance, the concrete type of scaling as a function of the parameter is not crucial; but there is, of course, a vast plurality of possibilities for scaling.

The parameter for state of health SoH, thus, for example, capacity $C_{akt}$ or internal resistance $R_{akt}$ is, however, typically not directly measurable and, hence, not known. This parameter, for example, state of health SoH thereto connected is, hence, to be simultaneously estimated by the nonlinear observer. Hence, nonlinear observer 13 described above is now extended by the estimate of state of health SoH or by a parameter thereof.

This combined SoH/SoC observer is based on the extended nonlinear battery model in form of local model network LMN or extended state space model 12 derived from said nonlinear battery model. In this instance, the parameter, for example, $C_{akt}$, $C_{akt}/C_{init}$, $R_{akt}$ or $R_{akt}/R_{init}$, directly or indirectly influences the input variables and/or model parameter of this state space model, as it is described above.

When choosing the architecture of the combined SoH/SoC observer, it may be distinguished between a complete observer for SoC and SoH and a cascaded observer.

In the case of the complete observer, SoC and SoH (or the parameters for state of health SoH) are simultaneously estimated. In this instance, an important aspect is to take into account the different time constants for observing SoC and SoH, because the SoH typically changes much more slowly than the SoC.

In the case of the cascaded observer, an internal observer (circle) exists, the objective of which is to determine the SoC most precisely and which is described above. An external observer 14 building upon internal observer 13 then provides a superior estimator for the SoH parameter, as it is shown in FIG. 10. The advantage of the cascading observer is that the different time constants for both observers already have been taken into account directly via the architecture. The SoH estimator may, by the separation into an internal and external observer, thus be operated by a significantly smaller sampling time. For this reason, the cascaded observer is preferred.

In FIG. 10, an observer 14 for state of health SoH or a parameter thereof, here, for example, $\hat{C}_{akt}$, has been added as a cascaded embodiment to the observer from FIG. 5. Determined extended state space model 12, extended by the above described account of the parameter for state of health SoH, and nonlinear observer 13 for state of charge SoC are again provided. An observer 14 for estimating the parameter of the state of health, here, current capacity $\hat{C}_{akt}$, has been added.

In order to estimate the parameter, an observation error e regarding the parameter is minimized. Observation error e is determined, for example, from the difference between measured output variable y, here being battery voltage U, and output variable $\hat{y}$, calculated from the nonlinear battery model or space model 12, here being estimated battery voltage $\hat{U}$. In order to estimate the parameter, observation error e is considered in a certain window of time t=0 . . . T; however, only past values are taken into account. The object of the estimation/optimization in observer 14 is now to minimize a specified quality measure regarding observation error e. For example, the minimum of the error squares $$\int_{t=0}^{T} e^2(t)\,dt = \min_{\hat{C}_{akt}}$$

may be consulted as a quality measure. Alternatively, an error distribution as symmetrical as possible may be targeted, for example, in the form $$\int_{\varepsilon=0}^{\varepsilon_{max}} (h(\varepsilon) - h(-\varepsilon))^2 \, d\varepsilon = \min_{\hat{C}_{akt}}$$

or a minimization of the offset of the estimation error, for example, in the form $$\int_{\varepsilon=-\varepsilon_{max}}^{\varepsilon_{max}} h(\varepsilon)\varepsilon \, d\varepsilon = \min_{\hat{C}_{akt}},$$

where the function may be any distribution function, for example, a normal distribution.

In this instance, a possible approach is that in time window t=0 . . . T output variable $\hat{U}$ is calculated for different capacities $C_{akt}$, for example, between a specified $C_{min}$ and a $C_{max}$, from nonlinear battery model or state space model 12 and the SoC is estimated and, in so doing, observation error e is determined by measured output variable U associated with a respective point in time. In this way, the quality measure may be determine capacity $C_{akt}$, which minimizes observation error e according to the quality measure. A specified quality measure of observation error e is thus minimized by adapting $C_{akt}$, finally resulting in that a capacity $C_{akt}$ is determined, which best describes the behavior of battery 10.

In this instance, ancillary and auxiliary conditions may also be taken into account, for example, a monotonous decrease of capacity $C_{akt}$ over time because battery 10 only can get older, however, not younger. The object of the combined observer generally is that the actual values minimize the deviations of the estimated states and, for this purpose, ancillary and auxiliary conditions are taken into account in form of equality or inequality constraints. These auxiliary conditions may be used, for example, to restrict or punish the rates of change of the capacity, the direction of SoH correction, etc. Depending on the architecture and formulation of the quality measure and the constraints, different optimization methods, yet known per se, may be used.

Observer 14 determined in this manner may then determine the SoH or a parameter of the SoH. In FIG. 11 shows parameter $C_{akt}$, estimated by the combined SoH/SoC observer, in relation to the nominal capacity $C_{init}$ of a battery, as a function of the number of charging/discharging cycles Z (marked by "x"). Points represent the actually measured capacity. This evidences that state of health SoH or a parameter for said SoH may be estimated very well by the described method.

As the observer for state of health SoH is based on past data, the SoH estimation may occur much more slowly than the SoC estimation. So the observer for the SoC always takes into account the current estimation value for the SoH or the parameter for said SoH.

In the case of a complete observer, observer 14 would be integrated for the state of health SoH into observer 13 for the SoC.

What is claimed is:

1. A method for determining a control observer (13) to estimate a state of charge (SoC) of a battery (10), comprising the following method steps:
    specifying an initial excitation signal of the battery (10), wherein the excitation signal comprises a time sequence of a plurality of design points defined by a load current (1) and an SoC value;
    specifying an initial model of the battery (10) having a model output (y) and model parameters (ψ);
    determining an optimized experimental design in form of an optimized time sequence of design points by use of a model based design of experiments method on the basis of a Fisher information matrix ($I_{FIM}$), defined by $$I_{FIM} = \frac{1}{\sigma^2} \sum_{k=1}^{N} \frac{\partial y(k,\psi)}{\partial \psi} \frac{\partial y(k,\psi)^T}{\partial \psi}$$

and a judgment criterion;

impinging the battery (10) with the individual design points in the time-sequence according to the determined experimental design, wherein measurements are obtained by state variables of the battery (10);

determining a nonlinear model of the battery (10) on the basis of the measurements and by a local model network comprising a number of local, linear, time-variant, and dynamic models ($LM_i$), which are respectively valid in specific ranges of input variables, wherein the model output is determined as a weighted linear combination of the outputs of the local models ($LM_i$);

converting the local models ($LM_i$) of the model network into local, linear state space models having a state vector comprising the SoC;

creating a local observer for each local, linear state space model;

creating the control observer (13) from a linear combination of the local observers; and wherein the SoC of the battery is estimated based on the control observer by a battery management system which uses the SoC to control the operation of the battery.

2. The method according to claim 1, wherein the optimized experimental design is determined by minimizing a result function $$J_{opt} = \alpha \frac{J_{FIM,init}}{J_{FIM,opt}} + (1-\alpha) \frac{T_{opt}}{T_{init}},$$

wherein $J_{FIM}$ is the determinant of the Fisher information matrix and $\alpha$ is a weighting factor.

3. The method according to claim 1, wherein each ith local model ($LM_i$) of the local model network (LMN) comprises a validity function ($\Phi_i$) and a model parameter vector $\theta$, wherein the model parameter vector ($\theta_i$) includes all model parameter for the ith model ($LM_i$) and the validity function ($\Phi_i$) defines the validity range of the ith local model ($LM_i$), and a local estimate of output variable $\hat{y}_i(k)$ of the ith local model ($LM_i$) is determined at the point in time k from $\hat{y}_i(k)=x^T(k)\theta_i$, wherein x(k) references a regression vector, which comprises present and past inputs and outputs, that the global model output $\hat{y}(k)$ is determined from the linear combination by weighting the local model outputs via the validity function ($\Phi_i$) according to $$y(k) = \sum_{i=1}^{M} \Phi_i(k)\hat{y}_i(k),$$

and wherein the model parameter vector ($\theta_i$) is determined by an optimization, which minimizes the error between estimated output variable and measured output variable.

4. The method according to claim 3, wherein for each ith local model ($LM_i$) a state vector $z_i(k)=A_i z(k-1)+B_i u(k)$ is applied, wherein a system matrix $A_i$ and a input matrix $B_i$ result from the determined model parameter vector ($\theta_i$), and the total system state results by weighting the local states with the validity function ($\Phi_i$) in $$z(k) = \sum_{i=1}^{M} \Phi_i(k-1)\{A_i z(k-1) + B_i u(k)\}$$

and the global model output in y(k)=Cz(k), with C=[1 0 . . . 0.0], and for each local state a local Kalman filter having a gain matrix $K_i$ is determined to estimate the local state.

5. The method according to claim 4, wherein the estimated state $\hat{z}(k)$, which comprises the estimated SoC, results from the equation $$\hat{z}(k) = \sum_{i=1}^{M} \Phi_i(k-1)\{z_i^*(k) + K_i[y(k) - \hat{y}(k)]\}$$

with $z_i^*(k) = A_i \hat{z}(k-1) + B_i u(k)$ and $$\hat{y}(k) = \sum_{i=1}^{M} \Phi_i(k-1)Cz_i^*(k).$$

6. The method according to claim 1, wherein at least one input variable of the local model network (LMN) is scaled by at least one parameter ($C_{akt}$, $R_{akt}$) for a state of health (SoH) of the battery (10).

7. The method according to claim 3, wherein at least one model parameter of the local model network (LMN) is scaled by at least one parameter ($C_{akt}$, $R_{akt}$) for a state of health (SoH) of the battery (10).

8. The method according to claim 6, wherein the observer (13) for the SoC is extended by an observer (14) for the parameter ($C_{akt}$, $R_{akt}$).

9. The method according to claim 8, wherein the observer (14) for the SoH minimizes an observation error (e) between the measured output variable (y) and the estimated output variable ($\hat{y}$) of the nonlinear battery model with the aid of a specified quality measure for the observation error (e) in relation to the parameter ($C_{akt}$, $R_{akt}$).

* * * * *